(12) United States Patent
Leng et al.

(10) Patent No.: US 11,324,125 B2
(45) Date of Patent: May 3, 2022

(54) DIVERSIFIED ASSEMBLY PRINTED CIRCUIT BOARD AND METHOD FOR MAKING THE SAME

(71) Applicant: SHENNAN CIRCUITS CO., LTD., Shenzhen (CN)

(72) Inventors: Ke Leng, Shenzhen (CN); Hailong Liu, Shenzhen (CN); Jinfeng Liu, Shenzhen (CN); Fengwu Wu, Shenzhen (CN); Li Chen, Shenzhen (CN); Lihua Zhang, Shenzhen (CN)

(73) Assignee: SHENNAN CIRCUITS CO., LTD., Shenzhen (CN)

( * ) Notice: Subject to any disclaimer, the term of this patent is extended or adjusted under 35 U.S.C. 154(b) by 0 days.

(21) Appl. No.: 17/106,142

(22) Filed: Nov. 29, 2020

(65) Prior Publication Data
US 2021/0084773 A1  Mar. 18, 2021

Related U.S. Application Data

(63) Continuation of application No. PCT/CN2018/125657, filed on Dec. 29, 2018.

(51) Int. Cl.
*H05K 1/00* (2006.01)
*H05K 1/09* (2006.01)
(Continued)

(52) U.S. Cl.
CPC .............. *H05K 3/36* (2013.01); *H05K 1/145* (2013.01); *H05K 3/3485* (2020.08); *H05K 2201/032* (2013.01)

(58) Field of Classification Search
CPC .......... H05K 1/18; H05K 1/144; H05K 1/145; H05K 1/162; H05K 3/00; H05K 3/10;
(Continued)

(56) References Cited

U.S. PATENT DOCUMENTS

| 4,724,040 A * | 2/1988 | Iwasa | ..................... H05K 1/162 216/16 |
| 4,734,156 A * | 3/1988 | Iwasa | ..................... H05K 3/246 216/13 |

(Continued)

FOREIGN PATENT DOCUMENTS

| CN | 1212115 A | 3/1999 |
| CN | 1201642 C | 5/2005 |

(Continued)

OTHER PUBLICATIONS

International Search Report, International Application No. PCT/CN2018/125657, dated Sep. 30, 2019 (10 pages).

(Continued)

*Primary Examiner* — Xiaoliang Chen (57) ABSTRACT

A diversified assembly printed circuit board includes a first printed circuit board provided with a multiple first conductive metals protruding from a surface of the first printed circuit board, and a multiple second printed circuit boards each provided with a multiple second conductive metals protruding from a surface of the each of the second printed circuit boards. At a connection position, solidified conductive metal paste is arranged between each of the first conductive metals and a corresponding second conductive metal to electrically connect each of the first conductive metals and the corresponding second conductive metal. A laminated adhesive sheet is arranged between each of the second printed circuit boards and the first printed circuit board to physically connect the second printed circuit boards and the first printed circuit board.

16 Claims, 8 Drawing Sheets

(51) Int. Cl.

| | |
|---|---|
| *H05K 1/18* | (2006.01) |
| *H05K 3/00* | (2006.01) |
| *H05K 3/10* | (2006.01) |
| *H05K 3/24* | (2006.01) |
| *H05K 3/36* | (2006.01) |
| *H05K 3/40* | (2006.01) |
| *H05K 3/42* | (2006.01) |
| *H05K 3/46* | (2006.01) |
| *H01L 21/44* | (2006.01) |
| *H01L 21/48* | (2006.01) |
| *H01L 21/60* | (2006.01) |
| *H01L 21/70* | (2006.01) |
| *H01L 21/268* | (2006.01) |
| *H01L 21/768* | (2006.01) |
| *H01L 23/00* | (2006.01) |
| *H01L 23/31* | (2006.01) |
| *H01L 23/66* | (2006.01) |
| *H01L 23/367* | (2006.01) |
| *H01L 23/373* | (2006.01) |
| *H01L 23/498* | (2006.01) |
| *H01L 23/522* | (2006.01) |
| *H01L 23/538* | (2006.01) |
| *H05K 3/34* | (2006.01) |
| *H05K 1/14* | (2006.01) |

(58) Field of Classification Search
CPC .. H05K 3/24; H05K 3/36; H05K 3/40; H05K 3/42; H05K 3/46; H05K 3/107; H05K 3/246; H05K 3/462; H05K 1/00; H05K 1/09; H01L 21/44; H01L 21/48; H01L 21/60; H01L 21/70; H01L 21/268; H01L 21/768; H01L 23/00; H01L 23/31; H01L 23/66; H01L 23/367; H01L 23/373; H01L 23/498; H01L 23/522; H01L 23/538
USPC ........ 174/261, 255; 361/758, 760, 761, 785, 361/792; 438/108, 109, 118, 613
See application file for complete search history.

(56) References Cited

U.S. PATENT DOCUMENTS

| | | | | |
|---|---|---|---|---|
| 4,735,676 A | * | 4/1988 | Iwasa | H05K 3/4664 |
| | | | | 216/18 |
| 5,994,166 A | * | 11/1999 | Akram | H05K 1/144 |
| | | | | 257/686 |
| 6,025,648 A | * | 2/2000 | Takahashi | H01L 25/105 |
| | | | | 257/685 |
| 8,031,474 B2 | * | 10/2011 | Ogawa | H05K 1/186 |
| | | | | 361/761 |
| 8,211,745 B2 | * | 7/2012 | Eom | H01L 24/29 |
| | | | | 438/108 |
| 10,211,176 B2 | * | 2/2019 | Jang | H01L 24/13 |
| 11,075,133 B2 | * | 7/2021 | Chen | H01L 25/0657 |
| 2004/0104042 A1 | * | 6/2004 | Takase | H05K 3/0038 |
| | | | | 174/255 |
| 2013/0153269 A1 | | 6/2013 | Takahashi et al. | |
| 2015/0270243 A1 | * | 9/2015 | Yang | H01L 25/50 |
| | | | | 438/118 |
| 2016/0079195 A1 | * | 3/2016 | Tanaka | H01L 24/09 |
| | | | | 257/737 |
| 2016/0172317 A1 | * | 6/2016 | Tsai | H01L 24/33 |
| | | | | 257/428 |
| 2017/0338206 A1 | * | 11/2017 | Seo | H01L 25/0657 |
| 2017/0358549 A1 | * | 12/2017 | Shinohara | H01L 25/0657 |
| 2018/0026012 A1 | * | 1/2018 | Akutsu | H01L 25/50 |
| | | | | 257/698 |
| 2018/0061812 A1 | * | 3/2018 | Lee | H01L 21/6835 |
| 2018/0090659 A1 | * | 3/2018 | Zoller | H01L 35/34 |
| 2018/0102470 A1 | * | 4/2018 | Das | H01L 39/2493 |
| 2019/0206797 A1 | * | 7/2019 | Lee | H01L 23/5384 |
| 2019/0206841 A1 | * | 7/2019 | Kim | H01L 23/3171 |
| 2019/0279936 A1 | * | 9/2019 | Lin | H01L 21/4857 |
| 2019/0313536 A1 | * | 10/2019 | Tanabe | H05K 3/107 |
| 2019/0350083 A1 | * | 11/2019 | Kato | H05K 3/0094 |
| 2019/0355680 A1 | * | 11/2019 | Chuang | H01L 21/568 |
| 2019/0378795 A1 | * | 12/2019 | Lee | H01L 24/92 |
| 2020/0020606 A1 | * | 1/2020 | Kim | H01L 23/3735 |
| 2020/0328143 A1 | * | 10/2020 | Marinov | H01P 5/04 |

FOREIGN PATENT DOCUMENTS

| | | |
|---|---|---|
| CN | 1812689 A | 8/2006 |
| CN | 101449630 A | 6/2009 |
| CN | 1812689 B | 1/2011 |
| CN | 102124824 A | 7/2011 |
| CN | 102655716 A | 9/2012 |
| CN | 103167727 A | 6/2013 |
| DE | 102018201911 A1 | 8/2018 |
| JP | 2004228165 A | 8/2004 |
| JP | 2006324282 A | 11/2006 |

OTHER PUBLICATIONS

Notice of reasons for refusal, Japanese Application No. 2021-512981, dated Dec. 27, 2021 (8 pages).

* cited by examiner

DIVERSIFIED ASSEMBLY PRINTED CIRCUIT BOARD AND METHOD FOR MAKING THE SAME

CROSS-REFERENCE TO RELATED APPLICATIONS

The present disclosure is a continuation-application of International (PCT) Patent Application No. PCT/CN2018/125657 filed Dec. 29, 2018 in the State Intellectual Property Office of China.

TECHNICAL FIELD

The present disclosure relates to the field of circuit board technology, and in particular, to a diversified assembly printed circuit board and a method for making the same.

BACKGROUND

With the rapid development of miniaturization of electronic products, the limitations of traditional electronic assembly have become more and more prominent.

For example, in the traditional welding method, solder paste is used. Solder paste can not be repeatedly welded after a first welding because of the properties of solder paste itself. Thus, the solder paste cannot be repeatedly stacked in a Z-direction. If the solder paste is re-welded, the solder paste will melt again, which will result in a short circuit or open circuit.

Therefore, in the existing technology, solder paste cannot be stacked repeatedly in the Z-direction during electronic assembly. Thus, a complex spatial structure cannot be formed to save space and the complex interconnection structure of ultra-high integration is hindered.

SUMMARY

To solve the above technical problem, a technical scheme adopted by the present disclosure is to provide a diversified assembly printed circuit board. The diversified assembly printed circuit board includes a first printed circuit board provided with a plurality of first conductive metals protruding from a surface of the first printed circuit board, and a plurality of second printed circuit boards, wherein each of the second printed circuit boards is provided with a plurality of second conductive metals protruding from a surface of the each of the second printed circuit boards, and all the plurality of second printed circuit boards are connected with the first printed circuit board. At a connection position of each of the second printed circuit boards and the first printed circuit board, solidified conductive metal paste is arranged between each of the first conductive metals and a corresponding second conductive metal to electrically connect each of the first conductive metals and the corresponding second conductive metal, and a laminated adhesive sheet is arranged between each of the second printed circuit boards and the first printed circuit board to physically connect the second printed circuit boards and the first printed circuit board.

To solve the above technical problem, another technical scheme adopted by the present disclosure is to provide a method for making a diversified assembly printed circuit board. The method includes providing a first printed circuit board and a plurality of second printed circuit boards, wherein the first printed circuit board is provided with a plurality of first conductive metals protruding from a surface of the first printed circuit board, and each of the second printed circuit boards is provided with a plurality of second conductive metals protruding from a surface of the first printed circuit board. The method further includes attaching a laminated adhesive sheet and an isolation film successively to one side of each of the second printed circuit boards to be connected, forming a micropore in each of the second conductive metals to be electrically connected, wherein the micropore extends through the laminated adhesive sheet and the isolation film and each of the second conductive metals are exposed in the micropore, plugging metal paste into the micropore to form conductive metal paste, removing the isolation films, attaching each of the second printed circuit boards to the first printed circuit board according to preset connection position, and compressing the first printed circuit board and the plurality of second printed circuit boards to obtain the diversified assembly printed circuit board. At a connection position of each of the second printed circuit boards and the first printed circuit board, the solidified conductive metal paste is arranged between each of the first conductive metals and a corresponding second conductive metal to electrically connect each of the first conductive metals and the corresponding second conductive metal, and the laminated adhesive sheet is arranged between each of the second printed circuit boards and the first printed circuit board to physically connect the second printed circuit boards and the first printed circuit board.

BRIEF DESCRIPTION OF THE DRAWINGS

In order to make the technical solution described in the embodiments of the present disclosure more clearly, the drawings used for the description of the embodiments will be briefly described. Apparently, the drawings described below are only for illustration, but not for limitation. It should be understood that one skilled in the art may acquire other drawings based on these drawings, without making any inventive work.

DETAILED DESCRIPTION OF THE PREFERRED EMBODIMENTS

In order to facilitate the understanding of the present disclosure, the present disclosure will be described more fully hereinafter with reference to the accompanying drawings. Preferred embodiments of the present disclosure are given in the drawings. However, the present disclosure may be embodied in many different forms and is not limited to the embodiments described herein. Rather, these embodiments are provided so that the present disclosure will be more fully understood.

Figure 1:
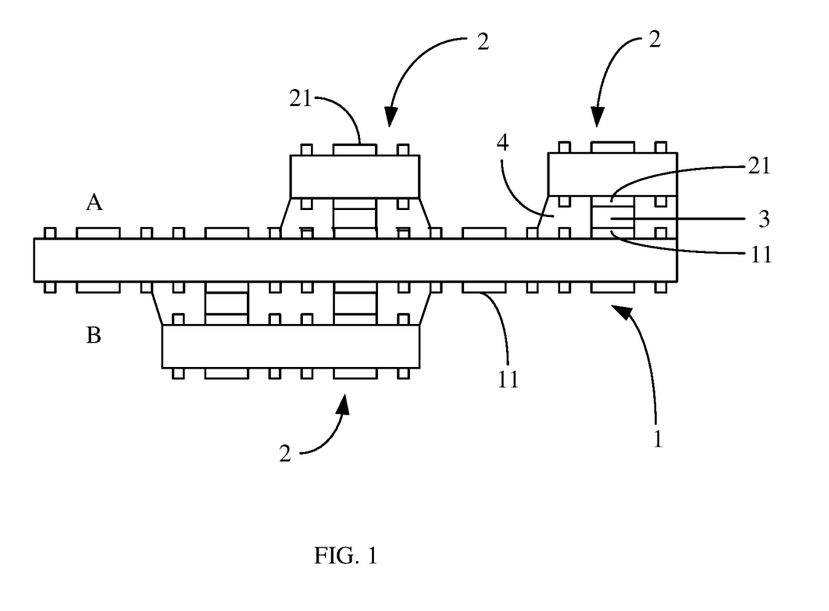
FIG. 1 is a schematic view of a diversified assembly printed circuit board according to one embodiment of the present disclosure.

FIG. 1 is a schematic diagram of a diversified assembly printed circuit board according to one embodiment of the present disclosure. The diversified assembly printed circuit board may include a first printed circuit board 1 and a plurality of second printed circuit boards 2.

The first printed circuit board 1 is provided with a plurality of first conductive metals 11 protruding from a surface of the first printed circuit board 1. Each second printed circuit board 2 is provided with a plurality of second conductive metals 21 protruding from a surface of the first printed circuit board 2. All the plurality of second printed circuit boards 2 may be connected with the first printed circuit board 1. At a connection position of each of the second printed circuit boards 2 and the first printed circuit board 1, solidified conductive metal paste 3 may be arranged between each of the first conductive metals 11 and a corresponding second conductive metal 21 to electrically connect each of the first conductive metals 11 and the corresponding second conductive metal 21. A laminated adhesive sheet 4 may be arranged between each of the second printed circuit boards 2 and the first printed circuit board 1 to physically connect the second printed circuit boards 2 and the first printed circuit board 1. Specifically, the laminated adhesive sheet 4 may be located where there is no first conductive metals 11 and second conductive metals 21 to non-electrically connect the second printed circuit boards 2 and the first circuit board 1.

The area of the first printed circuit board 1 may be larger than that of the second printed circuit board 2, and the area of the first printed circuit board 1 may accommodate a plurality of second printed circuit boards 2. The first printed circuit board 1 can be called a mother board, and each of the plurality of second printed circuit boards 2 may be called a daughter board. In the embodiment, the motherboard may connect with all daughter boards.

It should be noticed that the plurality of first conductive metals 11 may be arranged on the first side of the first printed circuit board 1, or on the second side opposite to the first side of the first printed circuit board 1, or on both the first side and the second side of the first printed circuit board 1. Similarly, the plurality of second conductive metals 21 may be arranged on the first side of the second printed circuit board 2, or on the second side opposite to the first side of the second printed circuit board 2, or on both the first side and the second side of the second printed circuit board 2. That is to say, the second printed circuit board 2 may be arranged on the first side and/or the second side of the first printed circuit board 1 according to the practical needs.

The specific existing forms of the first conductive metal 11 and the second conductive metal 21 may be a metal foil, a metal pad, or other existing forms. The material of the conductive metals (the first conductive metal 11 and the second conductive metal 21) can be copper, or other conductive materials, such as silver and so on. The conductive metal paste can be a conductive paste of gold powder, silver powder, copper powder, or silver copper alloy and so on.

Specifically, at a connection position of each of the second printed circuit boards 2 and the first printed circuit board 1, solidified conductive metal paste 3 may be arranged between each of the first conductive metals 11 and a corresponding second conductive metal 21 to electrically connect each of the first conductive metals 11 and the corresponding second conductive metal 21. A laminated adhesive sheet 4 may be arranged between each of the second printed circuit boards 2 and the first printed circuit board 1 to physically connect the second printed circuit boards 2 and the first printed circuit board 1. Specifically, the laminated adhesive sheet 4 may be located where there is no first conductive metals 11 and second conductive metals 21 to non-electrically connect the second printed circuit boards 2 and the first circuit board 1.

A traditional welding method for making the diversified assembly printed circuit board is not adopted by the present disclosure. In the traditional welding method, tin in a first solder joint will melt again during second welding, which will result short circuits or open circuits. In the embodiment, the solidified conductive metal paste 3 is surrounded by laminated adhesive sheets 4, which limits the conductive metal paste 3 in a fixed space. Therefore, even if heated again, the conductive metal paste 3 will not diffuse or shrink, and the second conductive metal 21 and the first conductive metal 11 connected by the conductive metal paste 3 are still electrically connected. Thus, the defects of traditional welding methods can be avoided.

In the embodiment of the present disclosure, the diversified assembly printed circuit board may include a first printed circuit board and a plurality of second printed circuit boards. The first printed circuit board is provided with a plurality of first conductive metals protruding from a surface of the first printed circuit board. Each second printed circuit board is provided with a plurality of second conductive metals protruding from a surface of the first printed circuit board. All the plurality of second printed circuit boards may be connected with the first printed circuit board. At a connection position of each of the second printed circuit boards and the first printed circuit board, solidified conductive metal paste may be arranged between each of the first conductive metals and a corresponding second conductive metal to electrically connect each of the first conductive metals and the corresponding second conductive metal. A laminated adhesive sheet may be arranged between each of the second printed circuit boards and the first printed circuit board to physically connect the second printed circuit boards and the first printed circuit board. Specifically, the laminated adhesive sheet may be located where there is no first conductive metals and second conductive metals to non-electrically connect the second printed circuit boards and the first circuit board. Since each of the second printed circuit boards can be connected to the first printed circuit board through the solidified conductive metal paste set between the second conductive metals and the corresponding first conductive metals, the defects of the traditional welding method can be avoided. Furthermore, on the basis of the structure of the diversified assembly printed circuit board formed by the first printed circuit board and the plurality of second printed circuit boards, other printed circuit boards can be further connected to the structure. This scheme above can provide technical support for stacking printed circuit boards in Z-direction and forming complex and ultra-high integrated spatial interconnection structure. The first printed circuit board can be connected with the plurality of second printed circuit boards and may be further connected with other required printed circuit boards, which can meet the diversity requirements of electronic assembly according to the actual application requirements.

Figure 2:
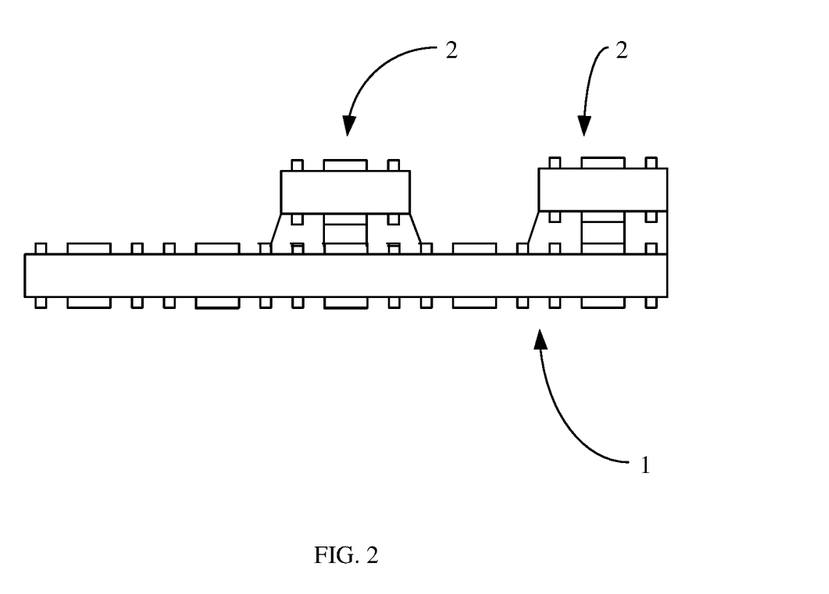
FIG. 2 is a schematic view of a diversified assembly printed circuit board according to another embodiment of the present disclosure.

Referring to FIG. 2, in one embodiment, the plurality of second printed circuit boards 2 may be located on the same side of the first printed circuit board 1 (shown in FIG. 2, the plurality of second printed circuit boards 2 may be all located on the upper side of the first printed circuit board 1). Further, the plurality of second printed circuit boards 2 may be spaced apart from each other and located on the same side of the first printed circuit board 1. In other words, the plurality of second printed circuit board 2 may be separated from each other to leave space for other electronic elements to be assembled. Certainly, according to the actual needs, the plurality of second printed circuit boards 2 can be arranged on the same side of the first printed circuit board 1 at intervals. The distance between any two adjacent second printed circuit boards 2 may be the same or different. In this way, diversified assembly can be realized to meet diversified needs.

Figure 3:
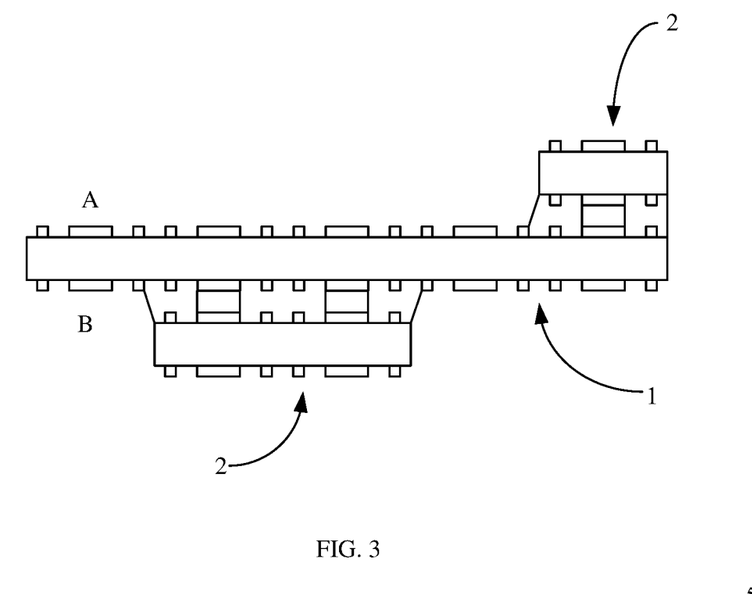
FIG. 3 is a schematic view of a diversified assembly printed circuit board according to another embodiment of the present disclosure.

Referring to FIG. 3, in another embodiment, some of the second printed circuit boards 2 may be located on a first side A of the first printed circuit board 1, and some other second printed circuit boards 2 may be located on a second side B of the first printed circuit board 1. The first side A can be opposite to the second side B.

Further, referring to FIG. 3, the number of the second printed circuit boards 2 may be two. The two second printed circuit boards 2 may be spaced apart from each other and respectively located on the first side A and the second side B of the first printed circuit board 1. That is, one second printed circuit board 2 may be located on the first side A of the first printed circuit board 1, the other second printed circuit board 2 may be located on the first side B of the first printed circuit board 1, and the two printed circuit boards 2 may be spaced from each other.

Certainly, according to the actual needs, the plurality of second printed circuit boards 2 can be arranged on different sides (i.e., the first side A and the second side B) of the first printed circuit board 1 at intervals. The distance between any two adjacent second printed circuit boards 2 may be the same or different. In this way, diversified assembly can be realized to meet diversified needs.

Figure 4:
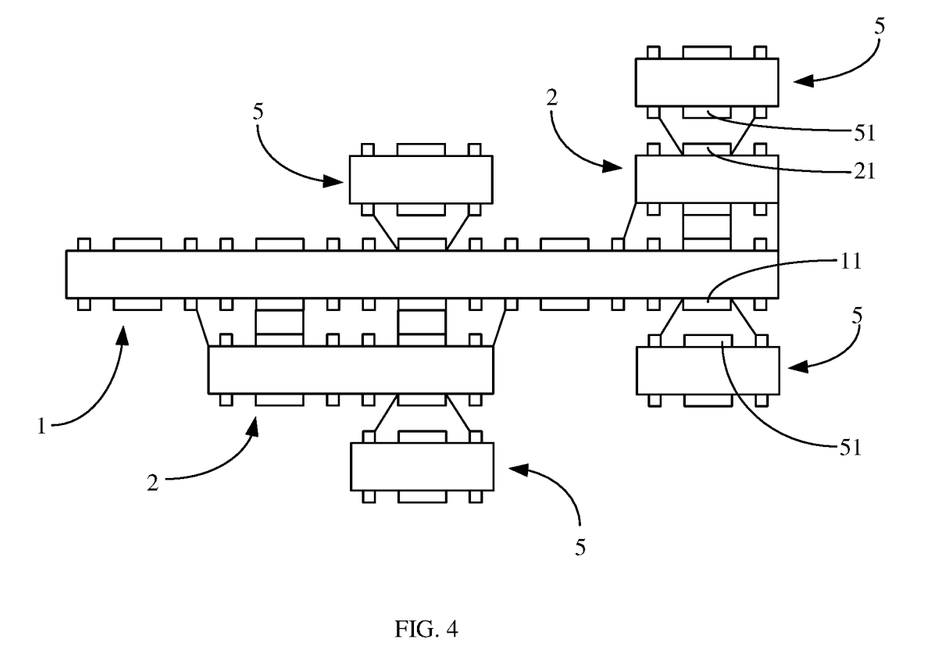
FIG. 4 is a schematic view of a diversified assembly printed circuit board according to another embodiment of the present disclosure.

Referring to FIG. 4, in another embodiment, diversified assembly printed circuit boards can also comprise a plurality of third printed circuit boards 5.

Each of the third printed circuit boards 5 may be provided with a plurality of third conductive metals 51 protruding from a surface of each of the third printed circuit boards 5. The plurality of third printed circuit boards 5 may be electrically connected with at least one of the first printed circuit board 1 and the second printed circuit boards 2. That is, the plurality of third printed circuit boards 5 can be only electrically connected with the first printed circuit board 1, or only electrically connected with the second printed circuit board 2. Alternatively, some of the third printed circuit boards 5 may be connected with the first printed circuit board 1 and some other third printed circuit boards 5 may be electrically connected with the second printed circuit boards 2. The connecting manners are not limited, and can be selected according to actual needs.

Specifically, if the plurality of third printed circuit boards 5 are only electrically connected with the first printed circuit board 1, metal tin from solder paste may be arranged between each of the third conductive metals 51 and a corresponding first conductive metal 11 at a connection position of each of the third printed circuit boards 5 and a corresponding first printed circuit board 1 to electrically connect each of the third conductive metals 51 and the corresponding first conductive metal 11.

If the plurality of third printed circuit boards 5 are only electrically connected with the second printed circuit board 2, the metal tin from the solder paste is arranged between each of the third conductive metals 51 and a corresponding second conductive metal 21 at a connection position of each of the third printed circuit boards 5 and a corresponding second printed circuit board 2 to electrically connect each of the third conductive metals 51 and the corresponding second conductive metal 21.

If some of the third printed circuit boards 5 are electrically connected with the first printed circuit board 1 and some other third printed circuit boards 5 are electrically connected with the second printed circuit boards 2, the metal tin from the solder paste is arranged between each of the third conductive metals 51 and a corresponding first conductive metal 11 at the connection position of each of the third printed circuit boards 5 and a corresponding first printed circuit board 1 to electrically connect each of the third conductive metals 51 and the corresponding first conductive metal 11. The metal tin from the solder paste is arranged between each of the third conductive metals 51 and a corresponding second conductive metal 21 at the connection position of each of the third printed circuit boards 5 and a corresponding second printed circuit board 2 to electrically connect each of the third conductive metals 51 and the corresponding second conductive metal 21.

In the above embodiment, on the basis of the structure of the diversified assembly printed circuit board formed by the first printed circuit board and the plurality of second printed circuit boards, the plurality of third printed circuit boards can be further arranged at the structure. Under the circumstances, the traditional welding method can be used to realize the diversity requirements of electronic assembly.

The laminated adhesive sheet may be a prepreg, and the conductive metal paste may be conductive copper paste.

In one embodiment, a diameter of the solidified conductive metal paste may be consistent with a length of each of the first conductive metals and each of the second conductive metals. In this way, the proper electrical connection between each of the first conductive metals and a corresponding second conductive metal can be realized. In addition, the diameter of the solidified conductive metal paste will not be larger than the length of the first conductive metal and the second conductive metal, so that excess heat energy which has adverse effect on the printed circuit boards will not be produced.

Furthermore, in practical application, the metals of the conductive metal paste, the first conductive metal and the second conductive metal can be the same to realize the uniformity of conductivity.

Figure 5:
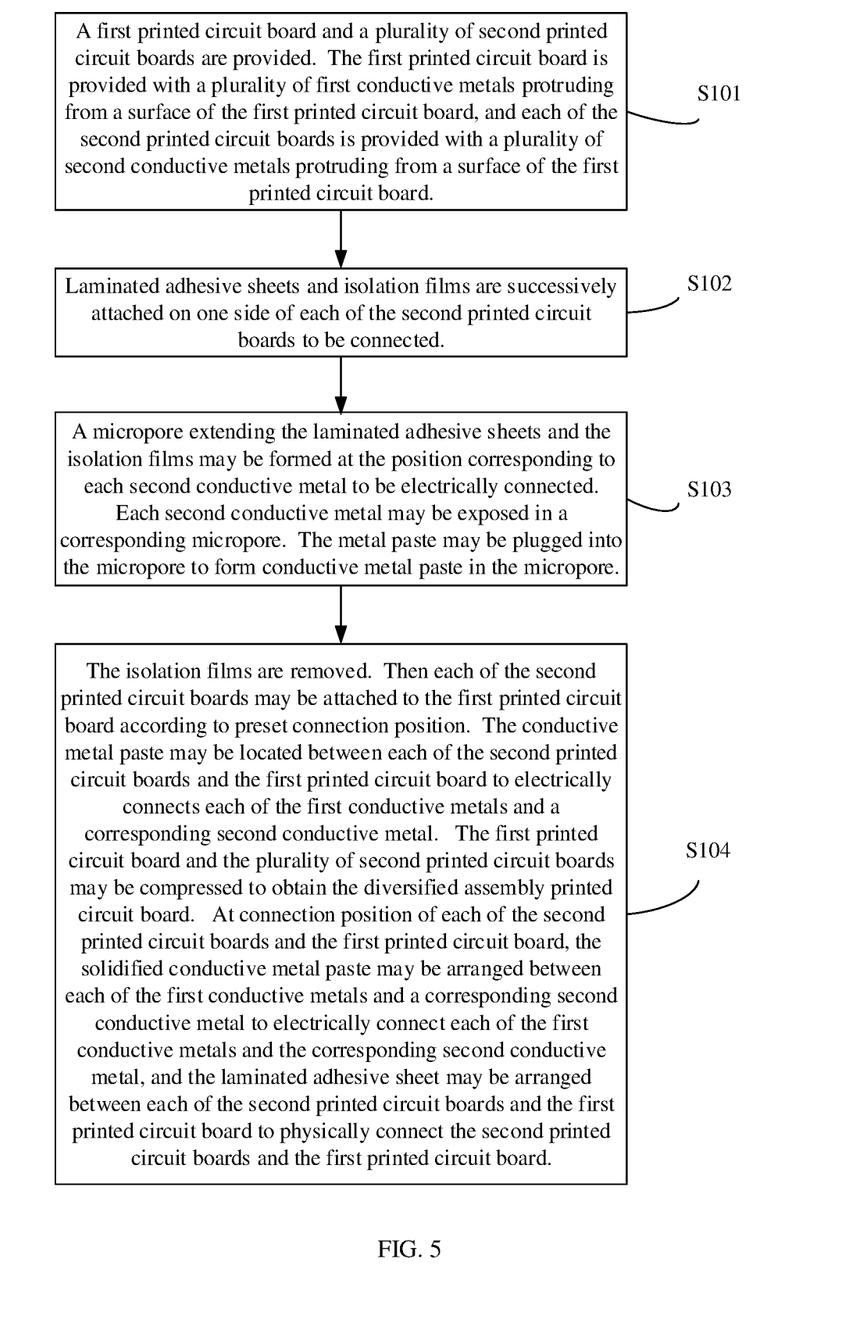
FIG. 5 is a flow chart of a method for making a diversified assembly printed circuit board according to an embodiment of the present disclosure.

FIG. 5 is the flow chart of a method for making a diversified assembly printed circuit board according to an embodiment of the present disclosure. It should be noted that the method of the embodiment can make any of the above diversified assembly printed circuit boards. For the relevant contents, please refer to the above diversified assembly printed circuit board part, which will not be described here. The method can include operations as blocks illustrated in FIG. 5:

At block S101, a first printed circuit board and a plurality of second printed circuit boards are provided. The first printed circuit board is provided with a plurality of first conductive metals protruding from a surface of the first printed circuit board, and each of the second printed circuit boards is provided with a plurality of second conductive metals protruding from a surface of each of the second printed circuit boards.

At block S102, laminated adhesive sheets and isolation films are successively attached on one side of each of the second printed circuit boards to be connected.

At block S103, a micropore extending the laminated adhesive sheets and the isolation films may be formed at the position corresponding to each of the second conductive metals to be electrically connected. Each of the second conductive metals may be exposed in a corresponding micropore. The metal paste may be plugged into the micropore to form conductive metal paste in the micropore.

At block S104, the isolation films are removed. Then each of the second printed circuit boards may be attached to the first printed circuit board according to the preset connection position. The conductive metal paste may be located between each of the second printed circuit boards and the first printed circuit board to electrically connect each of the first conductive metals and a corresponding second conductive metal. The first printed circuit board and the plurality of second printed circuit boards may be compressed to obtain the diversified assembly printed circuit board. At a connection position of each of the second printed circuit boards and the first printed circuit board, the solidified conductive metal paste may be arranged between each of the first conductive metals and a corresponding second conductive metal to electrically connect each of the first conductive metals and the corresponding second conductive metal, and the laminated adhesive sheet may be arranged between each of the second printed circuit boards and the first printed circuit board to physically connect the second printed circuit boards and the first printed circuit board.

The laminated adhesive sheet may be located where there is no first conductive metals and second conductive metals to non-electrically connect the second printed circuit boards and the first circuit board.

According to the embodiment of the present disclosure, since each of the second printed circuit boards can be connected to the first printed circuit board through the solidified conductive metal paste set between the second conductive metals and the corresponding first conductive metals, the defects of the traditional welding method can be avoided. Furthermore, on the basis of the structure of the diversified assembly printed circuit board formed by the first printed circuit board and the plurality of second printed circuit boards, other printed circuit boards can be further connected to the structure. This scheme above can provide technical support for stacking printed circuit boards in Z-direction and forming complex and ultra-high integrated spatial interconnection structure. The first printed circuit board can be connected with the plurality of second printed circuit boards and may be further connected with other required printed circuit boards, which can meet the diversity requirements of electronic assembly according to the actual application requirements.

The plurality of second printed circuit boards may be located on the same side of the first printed circuit board.

The plurality of second printed circuit boards may be spaced apart from each other and located on the same side of the first printed circuit board.

Some of the second printed circuit boards may be located on a first side of the first printed circuit board, and some other second printed circuit boards may be located on a second side of the first printed circuit board. The first side can be opposite to the second side.

The number of the second printed circuit boards may be two. The two second printed circuit boards may be spaced apart from each other and respectively located on the first side and the second side of the first printed circuit board.

Figure 6:
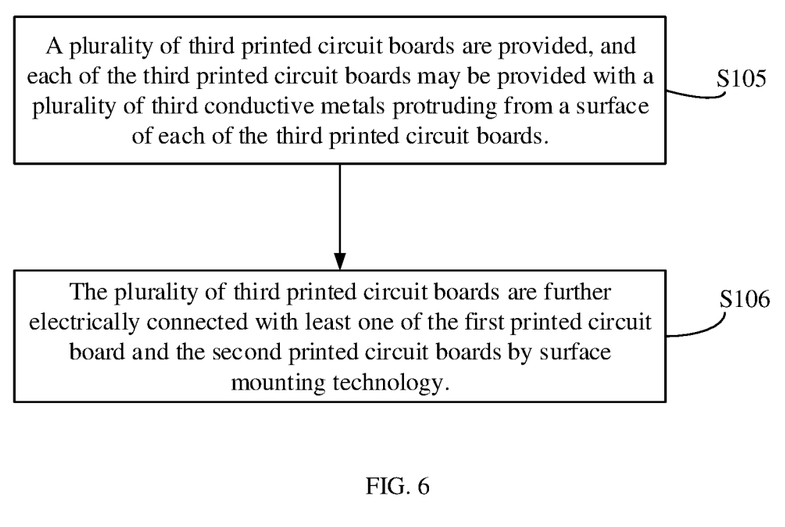
FIG. 6 is a flow chart of a method for making a diversified assembly printed circuit board according to another embodiment of the present disclosure.

Referring to FIG. 6, in an embodiment, the method further comprises the following operations.

At block Step S105, a plurality of third printed circuit boards are provided, and each of the third printed circuit boards may be provided with a plurality of third conductive metals protruding from a surface of each of the third printed circuit boards.

At block Step S106, the plurality of third printed circuit boards are further electrically connected with least one of the first printed circuit board and the second printed circuit boards by surface mounting technology.

Metal tin from solder paste is arranged between each of the third conductive metals and a corresponding first conductive metal at a connection position of each of the third printed circuit boards and the first printed circuit board to electrically connect each of the third conductive metals and the corresponding first conductive metal, and/or metal tin from solder paste is arranged between each of the third conductive metals and a corresponding second conductive metal at a connection position of each of the third printed circuit boards and a corresponding second printed circuit board to electrically connect each of the third conductive metals and the corresponding second conductive metal.

Surface mounted technology (SMT) refers to that assembly technology of directly attaching and welding surface assembled elements to the specified position on a surface of printed circuit board without drilling and inserting holes on the printed circuit board. Specifically, soft soldering method may be used to realize the welding of elements, or the mechanical and electrical connection between pins and pads of the printed circuit boards. In general, solder paste may be used in the soft soldering method.

The laminated adhesive sheet may be a prepreg, and the conductive metal paste may be conductive copper paste.

The attaching temperature can be in the range of 60° C. to 300° C., such as 60° C., 100° C., 150° C., 200° C., 250° C., 300° C. and so on. The attaching time can be in the range of 2 seconds to 360 seconds, such as 2 seconds, 10 seconds, 50 seconds, 100 seconds, 150 seconds, 200 seconds, 250 seconds, 300 seconds, 330 seconds, 360 seconds and so on.

A diameter of the solidified conductive metal paste is consistent with a length of each of the first conductive metals and each of the second conductive metals.

Referring to FIGS. 7 to 15, the first printed circuit board, the second printed circuit boards and the third printed circuit boards are used to illustrate the method.

Figure 7:
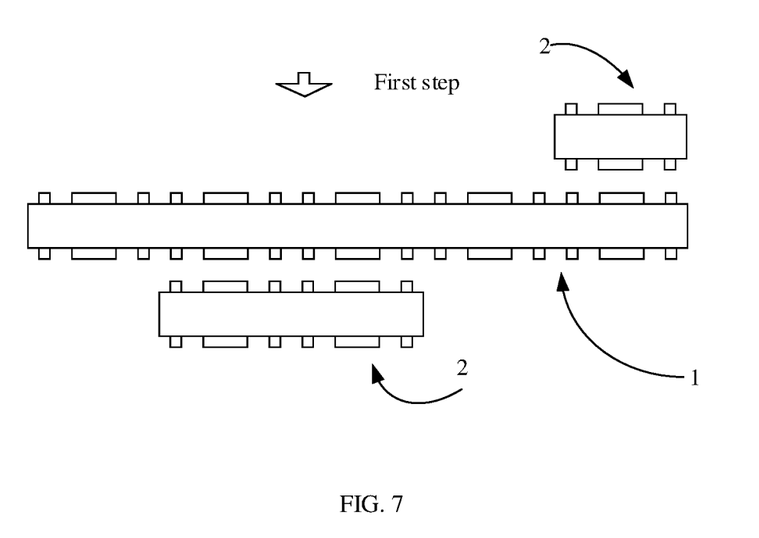
FIG. 7 is a schematic view of a first step of a method for making a diversified assembly printed circuit board in an application according to another embodiment of the present disclosure.

In first step, incoming materials may be prepared before assembly, that is, the first printed circuit board 1 and two second printed circuit boards 2 may be provided.

Figure 8:
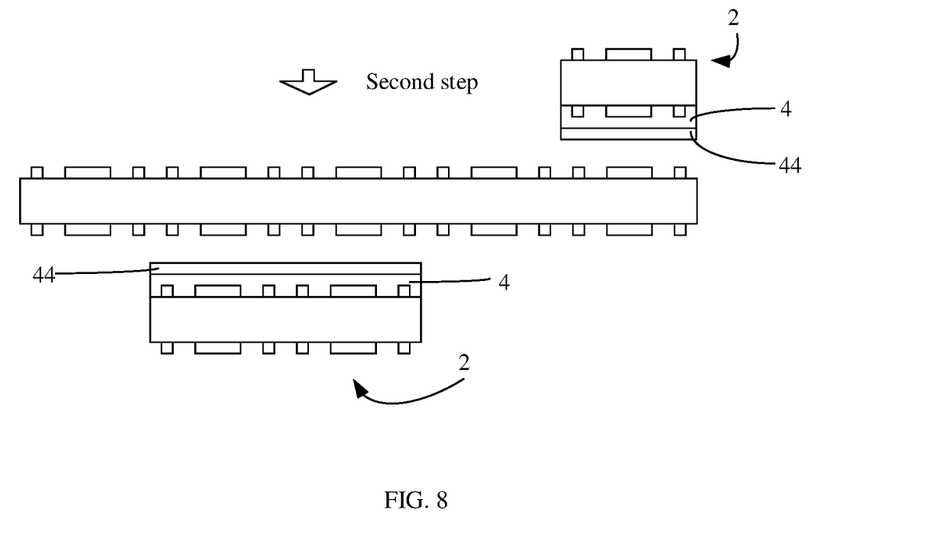
FIG. 8 is a schematic view of a second step of a method for making a diversified assembly printed circuit board in an application according to another embodiment of the present disclosure.

In second step, a laminated adhesive sheet 4 and an isolation film 44 may be attached to one side of each of the second printed circuit boards 2 to be connected successively.

Figure 9:
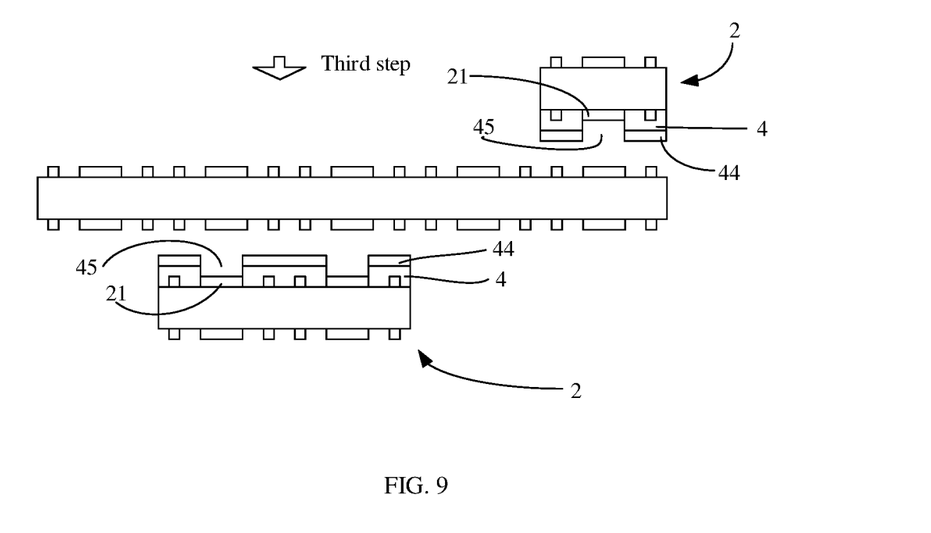
FIG. 9 is a schematic view of a third step of a method for making a diversified assembly printed circuit board in an application according to another embodiment of the present disclosure.

In third step, a micropore 45 extending through the laminated adhesive sheets 4 and the isolation films 44 may be formed at the position corresponding to each of the second conductive metals 21 to be electrically connected. Each of the second conductive metal s21 may be exposed in a corresponding micropore.

Figure 10:
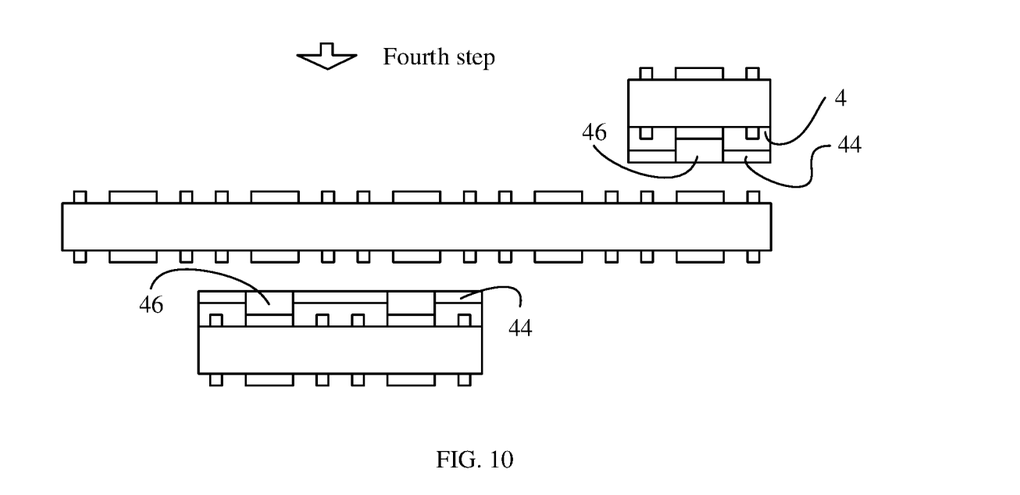
FIG. 10 is a schematic view of a fourth step of a method for making a diversified assembly printed circuit board in an application according to another embodiment of the present disclosure.

In fourth step, the metal paste may be plugged into each micropore 45 to form the conductive metal paste 46 in the each micropore 45.

Figure 11:
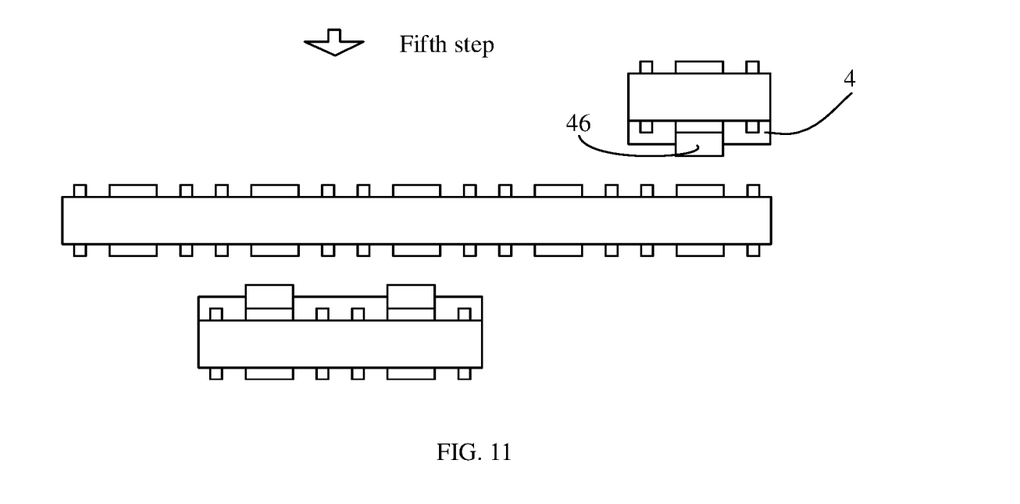
FIG. 11 is a schematic view of a fifth step of a method for making a diversified assembly printed circuit board in an application according to another embodiment of the present disclosure.

In fifth step, the isolation films 44 may be removed.

Figure 12:
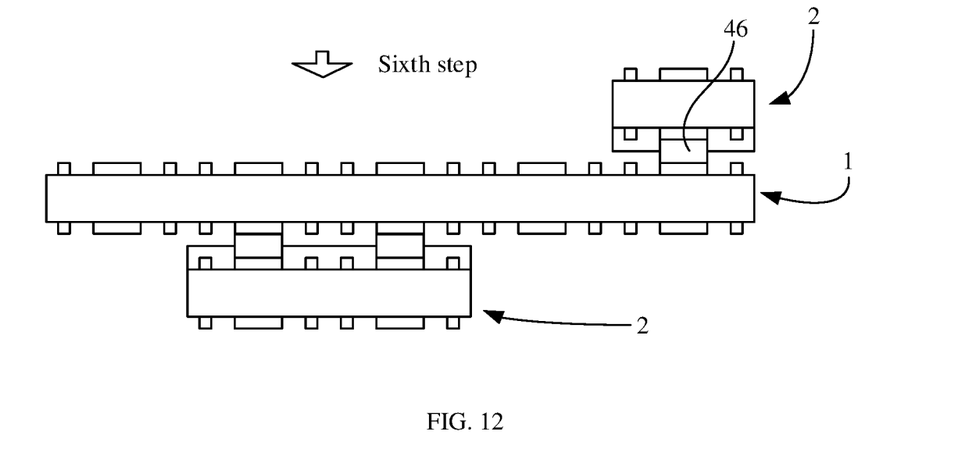
FIG. 12 is a schematic view of a sixth step of a method for making a diversified assembly printed circuit board in an application according to another embodiment of the present disclosure.

In sixth step, a side of each of the second printed circuit boards 2 formed with conductive metal paste 46 (solidified conductive metal paste 3) and the first printed circuit board 1 are located according to the preset connection position requirements.

Figure 13:
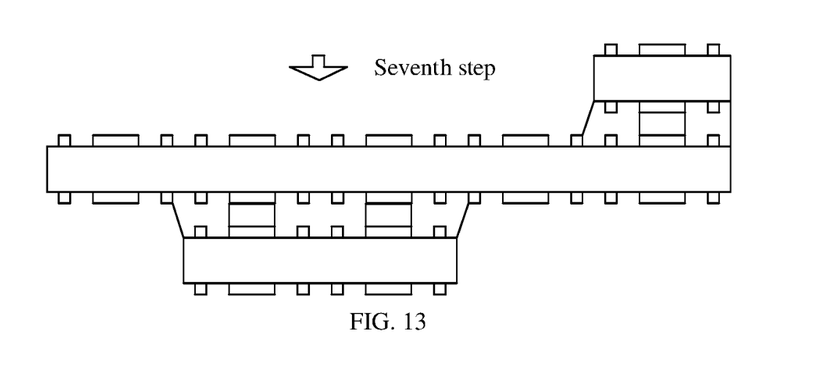
FIG. 13 is a schematic view of a seventh step of a method for making a diversified assembly printed circuit board in an application according to another embodiment of the present disclosure.

In seventh step, the diversified assembly printed circuit board may be obtained by pressing the above structure after locating.

Figure 14:
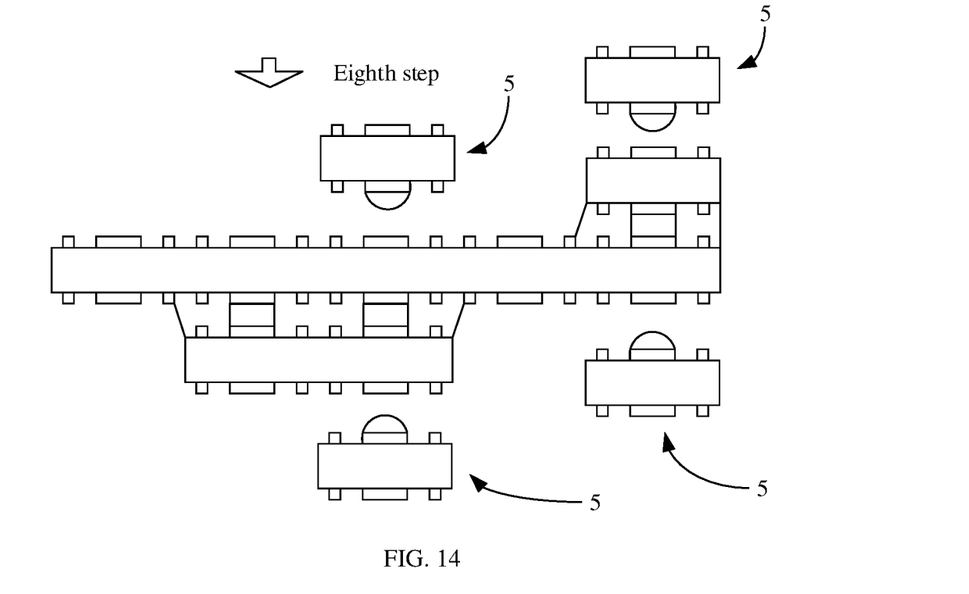
FIG. 14 is a schematic view of an eighth step of a method for making a diversified assembly printed circuit board in an application according to another embodiment of the present disclosure.

In eighth step, the plurality of third printed circuit boards 5 may be provided.

Figure 15:
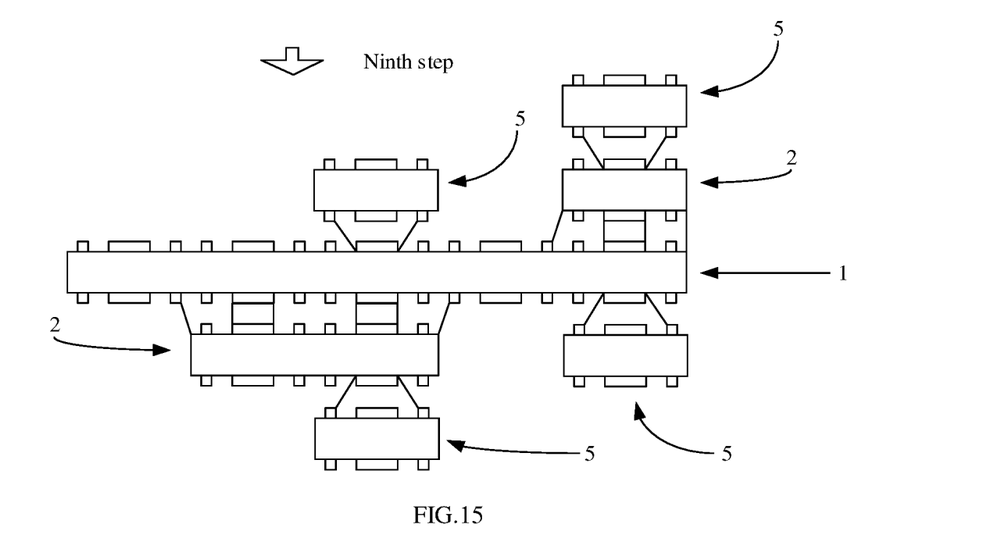
FIG. 15 is a schematic view of a ninth step of a method for making a diversified assembly printed circuit board in an application according to another embodiment of the present disclosure.

In ninth step, the plurality of third printed circuit boards 5 are further electrically connected with least one of the first printed circuit board 1 and the second printed circuit boards 2 by surface mounting technology.

This scheme above can provide technical support for stacking printed circuit boards in the Z-direction and forming complex and ultra-high integrated spatial interconnection structure. The first printed circuit board can be connected with the plurality of second printed circuit boards and may be further connected with other required printed circuit boards, which can meet the diversity requirements of electronic assembly according to the actual application requirements.

The above description is for the purpose of illustrating implementations of the present disclosure, but not to limit the scope of the present disclosure. Any equivalent structural or process transformation performed based on the drawings and the specification of the present disclosure, applied directly and indirectly in other related art, should be within the scope of the present disclosure.

What is claimed is:

1. A diversified assembly printed circuit board, comprising:
a first printed circuit board provided with a plurality of first conductive metals protruding from a surface of the first printed circuit board;
a plurality of second printed circuit boards, wherein each of the second printed circuit boards is provided with a plurality of second conductive metals protruding from a surface of each of the second printed circuit boards, and all the plurality of second printed circuit boards are connected with the first printed circuit board;
a plurality of third printed circuit boards, wherein each of the third printed circuit boards is provided with a plurality of third conductive metals protruding from a surface of each of the third printed circuit boards, the plurality of third printed circuit boards are electrically connected with at least one of the first printed circuit board and the second printed circuit boards;
wherein at a connection position of each of the second printed circuit boards and the first printed circuit board, solidified conductive metal paste is arranged between each of the first conductive metals and a corresponding second conductive metal to electrically connect each of the first conductive metals and the corresponding second conductive metal, and a laminated adhesive sheet is arranged between each of the second printed circuit boards and the first printed circuit board to physically connect the second printed circuit boards and the first printed circuit board;
wherein metal tin from solder paste is arranged between each of the third conductive metals and a corresponding first conductive metal at connection position of each of the third printed circuit boards and the first printed circuit board to electrically connect each of the third conductive metals and the corresponding first conductive metal; or
metal tin from solder paste is arranged between each of the third conductive metals and a corresponding second conductive metal at connection position of each of the third printed circuit boards and a corresponding second printed circuit board to electrically connect each of the third conductive metals and the corresponding second conductive metal.

2. The diversified assembly printed circuit board according to claim 1, wherein the plurality of second printed circuit boards are located on the same side of the first printed circuit board, and the laminated adhesive sheet is located where there is none of the first conductive metals and the second conductive metals to non-electrically connect the second printed circuit boards and the first circuit board.

3. The diversified assembly printed circuit board according to claim 2, wherein the plurality of second printed circuit boards are spaced apart from each other and located on the same side of the first printed circuit board.

4. The diversified assembly printed circuit board according to claim 1, wherein some of the second printed circuit boards are located on a first side of the first printed circuit board, and some other second printed circuit boards are located on a second side of the first printed circuit board, and the first side is opposite to the second side.

5. The diversified assembly printed circuit board according to claim 4, wherein the plurality of second printed circuit boards comprise two second printed circuit boards, the two second printed circuit boards are spaced apart from each other, one second printed circuit board is located on the first side of the first printed circuit board and the other second printed circuit board is located on the second side of the first printed circuit board.

6. The diversified assembly printed circuit board according to claim 1, wherein the laminated adhesive sheet is a prepreg, and the conductive metal paste is conductive copper paste.

7. The diversified assembly printed circuit board according to claim 1, wherein a diameter of the solidified conductive metal paste is consistent with a length of each of the first conductive metals and each of the second conductive metals.

8. A method for making the diversified assembly printed circuit board according to claim 1, wherein the method comprises:
providing a first printed circuit board and a plurality of second printed circuit boards, wherein the first printed circuit board is provided with a plurality of first conductive metals protruding from a surface of the first printed circuit board, and each of the second printed circuit boards is provided with a plurality of second conductive metals protruding from a surface of each of the second printed circuit boards;
attaching a laminated adhesive sheet and an isolation film successively to one side of each of the second printed circuit boards to be connected;
forming a micropore in each of the second conductive metals to be electrically connected, wherein the micropore extends through the laminated adhesive sheet and the isolation film and each of the second conductive metals is exposed in the micropore;
plugging metal paste into the micropore to form conductive metal paste;
removing the isolation film;
attaching each of the second printed circuit boards to the first printed circuit board according to preset connection position requirements;
compressing the first printed circuit board and the plurality of second printed circuit boards to obtain the diversified assembly printed circuit board;
providing a plurality of third printed circuit boards, wherein each of the third printed circuit boards is provided with a plurality of third conductive metals protruding from a surface of each of the third printed circuit boards; and
electrically connecting the plurality of third printed circuit boards with at least one of the first printed circuit board and the second printed circuit boards by surface mounting technology;
wherein at a connection position of each of the second printed circuit boards and the first printed circuit board, the solidified conductive metal paste is arranged between each of the first conductive metals and a corresponding second conductive metal to electrically connect each of the first conductive metals and the corresponding second conductive metal, and the laminated adhesive sheet is arranged between each of the second printed circuit boards and the first printed circuit board to physically connect the second printed circuit boards and the first printed circuit board;
wherein metal tin from solder paste is arranged between each of the third conductive metals and a corresponding first conductive metal at connection position of each of the third printed circuit boards and the first printed circuit board to electrically connect each of the third conductive metals and the corresponding first conductive metal; or
metal tin from solder paste is arranged between each of the third conductive metals and a corresponding second conductive metal at connection position of each of the third printed circuit boards and a corresponding second printed circuit board to electrically connect each of the third conductive metals and the corresponding second conductive metal.

9. The method according to claim 8, wherein the plurality of second printed circuit boards are located on the same side of the first printed circuit board, and the laminated adhesive sheet is located where there is none of the first conductive metals and the second conductive metals to non-electrically connect the second printed circuit boards and the first circuit board.

10. The method according to claim 9, wherein the plurality of second printed circuit boards are spaced apart from each other and located on the same side of the first printed circuit board.

11. The method according to claim 8, wherein some of the second printed circuit boards are located on a first side of the first printed circuit board, and some other second printed circuit boards are located on a second side of the first printed circuit board, and the first side is opposite to the second side.

12. The method according to claim 11, wherein the number of the second printed circuit boards is two, the two second printed circuit boards are spaced apart from each other, one second printed circuit board is located on the first side of the first printed circuit board and the other second printed circuit board is located on the second side of the first printed circuit board.

13. The method according to claim 8, wherein the laminated adhesive sheet is a prepreg, and the conductive metal paste is conductive copper paste.

14. The method according to claim 13, wherein, an attaching temperature is in the range of 60° C. to 300° C., and an attaching time is in the range of 2 seconds to 360 seconds to attach the laminated adhesive sheet and the isolation film.

15. The method according to claim 8, wherein a diameter of the solidified conductive metal paste is consistent with a length of each of the first conductive metals and each of the second conductive metals.

16. The method according to claim 8, wherein in the step of attaching each of the second printed circuit boards to the first printed circuit board according to preset connection position, a side of each of the second printed circuit boards formed with conductive metal paste and the first printed circuit board are located according to the preset connection position requirements.

* * * * *